United States Patent [19]

Suzu

[11] Patent Number: 6,043,637
[45] Date of Patent: Mar. 28, 2000

[54] VOLTAGE GENERATOR CIRCUIT

[75] Inventor: Takayuki Suzu, Kanagawa, Japan

[73] Assignee: NEC Corporation, Japan

[21] Appl. No.: 09/197,967

[22] Filed: Nov. 23, 1998

[30] Foreign Application Priority Data

Dec. 1, 1997 [JP] Japan ................................. 9-330393

[51] Int. Cl.[7] .............................. G05F 3/16; H03L 5/00; G11C 11/40
[52] U.S. Cl. ....................... 323/313; 323/312; 323/316; 327/540; 365/189.09
[58] Field of Search ................................... 323/313, 314, 323/315, 312, 316, 350; 327/540, 538; 365/201, 226, 189.09

[56] References Cited

U.S. PATENT DOCUMENTS

| | | | |
|---|---|---|---|
| 4,628,250 | 12/1986 | Lee .......................................... | 323/317 |
| 5,396,114 | 3/1995 | Lee et al. ................................. | 323/313 |
| 5,444,659 | 8/1995 | Yokokura ................................ | 365/201 |

FOREIGN PATENT DOCUMENTS 8-320827  11/1996  Japan .

*Primary Examiner*—Peter S. Wong
*Assistant Examiner*—Rajnikant B. Patel
*Attorney, Agent, or Firm*—Ostrolenk, Faber, Gerb & Soffen, LLP

[57] ABSTRACT

A voltage generator circuit includes a loading transistor circuit having a source terminal supplied with a power source voltage, a transfer gate circuit having a source terminal connected with the drain terminal of the loading transistor circuit, a clamping circuit having a drain terminal connected with the drain terminal of the transfer gate circuit and a source terminal which is grounded, and an inverter circuit which is provided between the drain terminal of the clamping circuit and the gate terminal of the transfer gate circuit. The gate terminal of the loading transistor circuit is supplied with a CEB (Chip Enable) signal. The gate terminal of the clamping circuit is connected with the drain terminal of the loading transistor circuit. The drain terminal of the loading transistor circuit, the source terminal of the transfer gate circuit and the gate terminal of the clamping circuit are all connected together to operate as an output terminal of the voltage generator circuit for outputting a constant voltage. When voltage as highs as the logical threshold voltage of the inverter circuit is applied to the drain terminal of the clamping circuit, the transfer gate circuit is turned OFF by turnover of the inverter circuit, and the clamping circuit is protected from the application of an extraordinarily high voltage and junction destruction.

11 Claims, 9 Drawing Sheets

VOLTAGE GENERATOR CIRCUIT

BACKGROUND OF THE INVENTION

The present invention relates to a voltage generator circuit, and in particular, to a voltage generator circuit which is employed in a mask ROM that is provided with multi-valued memory cells which can store three or more values in each bit.

DESCRIPTION OF RELATED ART

Voltage generator circuits which can generate a constant voltage are employed in a mask ROM (mask Read Only Memory), for example. These days, multivalued memory cells which can store and hold more than two values in each bit have been proposed for the mask ROM in order to increase degree of integration of the ROM. For example, four threshold voltages can be set in the multivalued memory cell by means of ion implantation: a first threshold voltage which is a little higher than the ground level, a second threshold voltage which is a little higher than the first threshold voltage, a third threshold voltage which is a little higher than the second threshold voltage and lower than power source voltage, and a fourth threshold voltage which is higher than the power source voltage.

FIG. 1 is a schematic circuit diagram showing a voltage generator circuit which has recently been proposed by the present inventors in Japanese Patent Application No.HEI08-320827. Referring to FIG. 1, the voltage generator circuit is composed of a differential amplifier circuit 600 and a reference voltage generator circuit 601. The reference voltage generator circuit 601 is composed of a loading MOS transistor circuit 602 (a transistor Q602) and a clamping circuit (voltage clamp) 603 (a transistor Q603 having the same construction and dimensions as those of the memory cell of the mask ROM). The transistor Q602 composing the loading MOS transistor circuit 602 is a P-channel MOS transistor, and the transistor Q603 composing the clamping circuit 603 is an N-channel MOS transistor. The source terminal of the loading MOS transistor circuit 602 is supplied with a power source voltage. The drain terminals of the loading MOS transistor circuit 602 and the clamping circuit 603 are connected together. The drain terminal and the gate terminal of the clamping circuit 603 are connected together. The source terminal of the clamping circuit 603 is grounded. In the transistor Q603 composing the clamping circuit 603, a threshold voltage chosen from the aforementioned four threshold voltages is set.

In the following, the operation of the voltage generator circuit of FIG. 1 will be explained mainly on the operation of the reference voltage generator circuit 601.

The loading MOS transistor circuit 602 passes current into the clamping circuit 603 as long as a CEB (Chip Enable) signal of an enabling level (LOW) is supplied to the gate terminal of the loading MOS transistor circuit 602.

In the case where the threshold voltage of the transistor Q603 composing the clamping circuit 603 is set equal to the first threshold voltage VT1, as long as the driving ability of the clamping circuit 603 is set larger enough in comparison with the driving ability of the loading MOS transistor circuit 602, the voltage at the output terminal CVOUT601 of the reference voltage generator circuit 601 becomes almost equal to the first threshold voltage VT1.

In the case where the threshold voltage of the transistor Q603 composing the clamping circuit 603 is set equal to the second threshold voltage VT2, as long the driving ability of the clamping circuit 603 is set larger enough in comparison with the driving ability of the loading MOS transistor circuit 602, the voltage at the output terminal CVOUT601 of the reference voltage generator circuit 601 becomes almost equal to the second threshold voltage VT2.

In the case where the threshold voltage of the transistor Q603 composing the clamping circuit 603 is set equal to the third threshold voltage VT3, as long as the driving ability of the clamping circuit 603 is set larger enough in comparison with the driving ability of the loading MOS transistor circuit 602, the voltage at the output terminal CVOUT601 of the reference voltage generator circuit 601 becomes almost equal to the third threshold voltage VT3.

In the case where the threshold voltage of the transistor Q603 composing the clamping circuit 603 is set equal to the fourth threshold voltage VT4, as long as the driving ability of the clamping circuit 603 is set larger enough in comparison with the driving ability of the loading MOS transistor circuit 602, the voltage at the output terminal CVOUT601 of the reference voltage generator circuit 601 becomes equal to the power source voltage.

In the above three cases with the threshold voltages VT1, VT2 and VT3, in fact, the voltage at the output terminal CVOUT601 of the reference voltage generator circuit 601 takes on values a little higher than the threshold voltage, depending on the driving abilities of the loading MOS transistor circuit 602 and the clamping circuit 603. The differential amplifier circuit 600 is connected to the reference voltage generator circuit 601 in order to increase driving ability of the output of the reference voltage generator circuit 601. The output of the voltage generator circuit is supplied to word lines of mask ROM etc.

FIG. 2 is a schematic circuit diagram showing another reference voltage generator circuit which can be employed in place of the reference voltage generator circuit 601 of FIG. 1. The reference voltage generator circuit of FIG. 2 has a plurality of clamping circuits 701~705 which are connected in parallel.

In the case of the reference voltage generator circuit of FIG. 2, due to the parallel connection of the five clamping circuits 701~705 to the loading MOS transistor circuit 700, high driving ability of a clamping circuit (i.e. the clamping circuits 701~705) can be obtained. Therefore, it is possible to let the output voltage of the voltage generator circuit reach the threshold voltage which has been set in the clamping circuits 701~705 faster, in comparison with the case of the voltage generator circuit of FIG. 1.

However, the voltage generator circuits described above involve the following drawbacks.

First, in the case of the voltage generator circuit of FIG. 1, when the threshold voltage of the clamping circuit 603 in the reference voltage generator circuit 601 is set equal to the highest fourth threshold voltage VT4, the voltage of the terminal CVOUT601 (which is the output terminal of the reference voltage generator circuit 601 and the drain and the (gate) terminal of the clamping circuit 603) might become extraordinarily high due to variations in the power source voltage etc., and thereby the drain terminal of the clamping circuit 603 is supplied with extraordinarily high voltage. As a result, the transistor Q603 employed for the clamping circuit 603, which has a limited junction withstand voltage, becomes incapable of withstanding the high voltage, and thereby a malfunction due to breakdown occurs in the transistor Q603.

The problem occurs since the transistor Q603 which is employed for the clamping circuit 603 is formed so as to have the same construction and dimensions as those of the memory cell in the mask ROM and thus the junction withstand voltage and the gate withstand voltage are low.

Second, in the case of the voltage generator circuit of FIG. 2, the threshold voltage of one clamping circuit 705, for example, in the parallel connection of the five clamping circuits 701~705 might be set extremely low due to trouble in manufacturing, etc. In such cases, the output voltage of the voltage generator circuit is necessitated to be low due to the extremely low threshold voltage of the clamping circuit 705.

The problem occurs since each of the clamping circuits 701~705 in the voltage generator circuit of FIG. 2 employs a "diode connection", that is, the gate terminal and the drain terminal of the clamping circuit are connected together. FIG. 3 is a graph showing the characteristics of the clamping circuits 701~705 in the voltage generator circuit of FIG. 2. If the threshold voltage of one of the clamping circuits 701~705 (the clamping circuit 705 in FIG. 3) is low, the output voltage of the reference voltage generator circuit (or the output voltage of the voltage generator circuit) becomes lower than a predetermined output voltage due to the low threshold voltage of the clamping circuit 705, as shown in FIG. 3.

SUMMARY OF THE INVENTION

It is therefore the primary object of the present invention to provide a voltage generator circuit in which circuit reliability can be improved, variation in the output voltage can be reduced, and thereby operation reliability of a mask ROM which employs the multivalued cells can be secured.

In accordance with a first aspect of the present invention, there is provided a voltage generator circuit comprising: a loading transistor circuit whose source terminal is supplied with a power source voltage; a transfer gate circuit whose source terminal is connected with the drain terminal of the loading transistor circuit; and a clamping circuit whose drain terminal is connected with the drain terminal of the transfer gate circuit and whose source terminal is grounded. In the voltage generator circuit, the gate terminal of the loading transistor circuit is supplied with a CEB (Chip Enable) signal. The gate terminal of the transfer gate circuit is supplied with a signal at the drain terminal of the transfer gate circuit which has been inverted. The gate terminal of the clamping circuit is connected with the drain terminal of the loading transistor circuit. The drain terminal of the loading transistor circuit, the source terminal of the transfer gate circuit and the gate terminal of the clamping circuit, which are all connected together, operate as an output terminal of the voltage generator circuit for outputting a constant voltage.

In accordance with a second aspect of the present invention, in the first aspect, the clamping circuit is composed of a parallel connection of two or more MOS transistors.

In accordance with a third aspect of the present invention, in the first aspect, the loading transistor circuit is composed of a series connection of two or more transistors whose gate terminals are supplied with the CEB (Chip Enable) signal.

In accordance with a fourth aspect of the present invention, in the first aspect, an inverter circuit, having an input terminal connected with the drain terminal of the clamping circuit and an output terminal, connected with the gate terminal of the transfer gate circuit, is provided for obtaining the signal at the drain terminal of the transfer gate circuit which has been inverted.

In accordance with a fifth aspect of the present invention, in the fourth aspect, the clamping circuit is composed of a parallel connection of two or more MOS transistors.

In accordance with a sixth aspect of the present invention, in the fourth aspect, the loading transistor circuit is composed of a series connection of two or more transistors whose gate terminals are supplied with the CEB (Chip Enable) signal.

In accordance with a seventh aspect of the present invention, in the first aspect, a NOR circuit, having a first input terminal connected with the drain terminal of the clamping circuit and a second input terminal supplied with the CEB (Chip Enable) signal and an output terminal connected with the gate terminal of the transfer gate circuit, is provided for obtaining the signal at the drain terminal of the transfer gate circuit which has been inverted.

In accordance with an eighth aspect of the present invention, in the seventh aspect, the clamping circuit is composed of a parallel connection of two or more MOS transistors.

In accordance with a ninth aspect of the present invention, in the seventh aspect, the loading transistor circuit is composed of a series connection of two or more transistors whose gate terminals are supplied with the CEB (Chip Enable) signal.

In accordance with a tenth aspect of the present invention, in the first aspect, the voltage generator circuit further comprises a differential amplifier which is connected to the output terminal for increasing its driving ability.

In accordance with an eleventh aspect of the present invention, in the tenth aspect, the voltage generator circuit is applied to a semiconductor memory device that is provided with multivalued memory cells in which threshold voltages selected from a plurality of threshold voltages are set according to write data.

BRIEF DESCRIPTION OF THE DRAWINGS

The objects and features of the present invention will become more apparent from the consideration of the following detailed description taken in conjunction with the accompanying drawings, in which.

DESCRIPTION OF THE PREFERRED EMBODIMENTS

Figure 1:
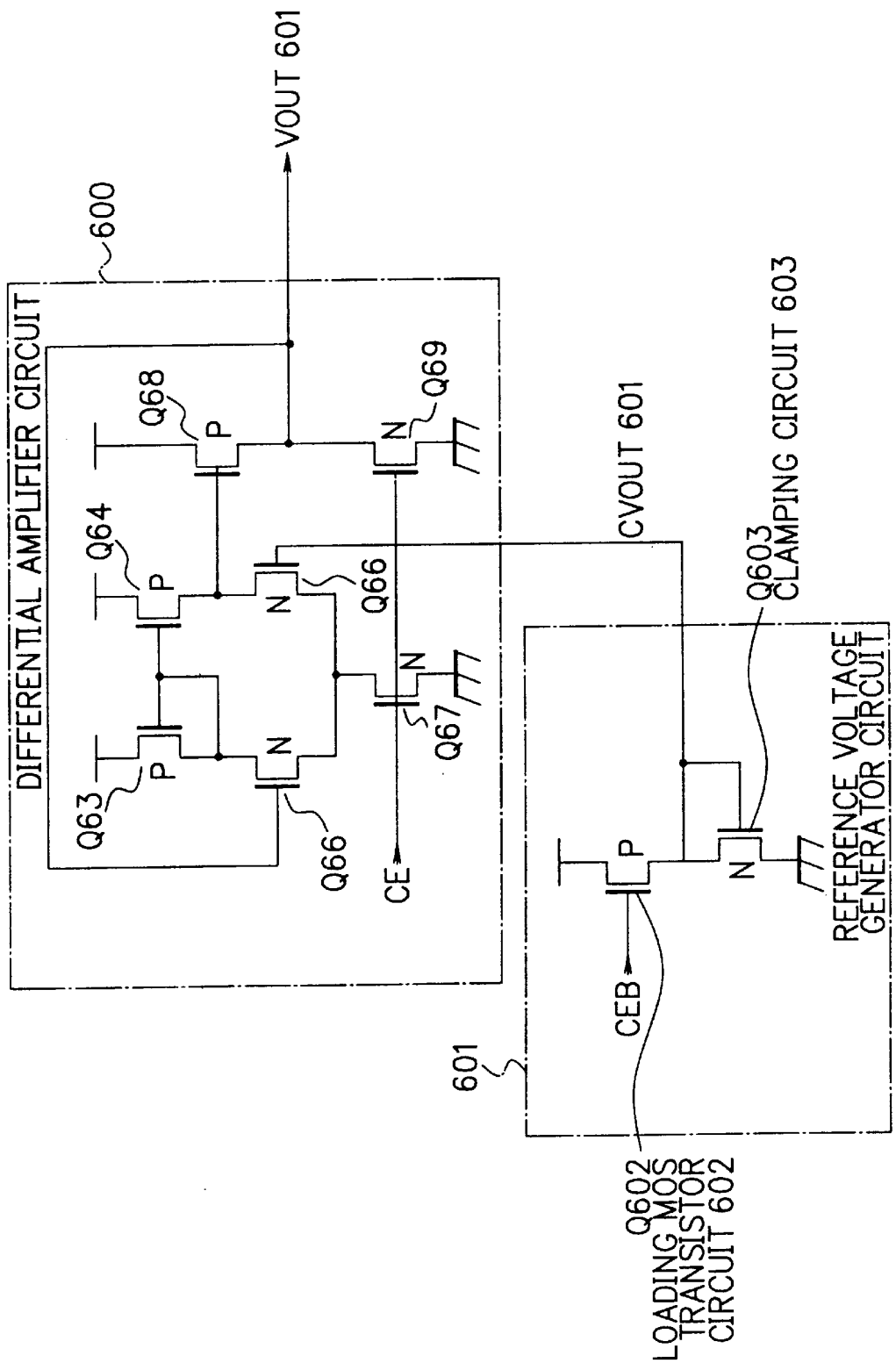
FIG. 1 is a schematic circuit diagram showing a voltage generator circuit which has recently been proposed by the present inventors.

Referring now to the drawings, a description will be given in detail of the preferred embodiments in accordance with the present invention.

Figure 4:
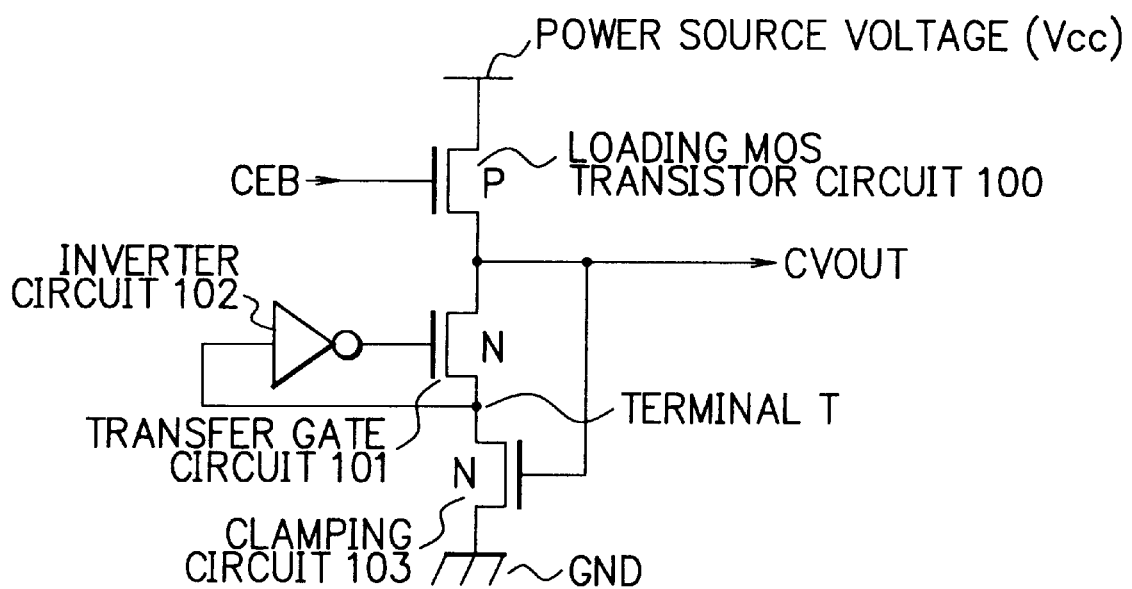
FIG. 4 is a schematic circuit diagram showing a voltage generator circuit according to a first embodiment of the present invention.

FIG. 4 is a schematic circuit diagram showing a voltage generator circuit according to a first embodiment of the present invention. Referring to FIG. 4, the voltage generator circuit of the first embodiment comprises a loading MOS transistor circuit 100 (P-channel transistor), a transfer gate circuit 101 (N-channel transistor), an inverter circuit 102, and a clamping circuit 103 (N-channel transistor).

The loading MOS transistor circuit 100 is supplied with a power source voltage Vcc to its source terminal and its drain terminal is connected to the source terminal of the transfer gate circuit 101. A CEB (Chip Enable) signal is supplied to the gate terminal of the loading MOS transistor circuit 100. The drain terminal of the transfer gate circuit 101 is connected with the drain terminal of the clamping circuit 103 and the gate terminal of the transfer gate circuit 101 is supplied with the output of the inverter circuit 102. The drain terminal of the transfer gate circuit 101 also (the drain terminal of the clamping circuit 103) is connected to the input terminal of the inverter circuit 102. The source terminal of the clamping circuit 103 is grounded and the gate terminal of the clamping circuit 103 is connected with the drain terminal of the loading MOS transistor circuit 100 and also (the source terminal of the transfer gate circuit 101).

The drain terminal of the loading MOS transistor circuit 100, the source terminal of the transfer gate circuit 101, and the gate terminal of the clamping circuit 103 are connected together as the output terminal CVOUT of the voltage generator circuit.

In the clamping circuit 103, a threshold voltage chosen from a plurality of threshold voltages is set, so that the voltage generator circuit can be applied to a mask ROM that is provided with memory cells which can store three or more values in each bit. For example, a threshold voltage chosen from four threshold voltages is set in the clamping circuit 103: a first threshold voltage which is a little higher than the ground level, a second threshold voltage which is a little higher than the first threshold voltage, a third threshold voltage which is a little higher than the second threshold voltage and lower than the power source voltage (Vcc), and a fourth threshold voltage which is higher than the power source voltage.

The inverter circuit 102 switches its output voltage(LOW to HIGH or HIGH to LOW) when the voltage at its input terminal crosses its logical threshold voltage. Basically, the logical threshold voltage of the inverter circuit 102 is set higher than the threshold voltage of the clamping circuit 103. However, the logical threshold voltage of the inverter circuit 102 is set lower than the junction withstand voltage of the clamping circuit 103 even in the case where the threshold voltage of the clamping circuit 103 is set higher than the power source voltage.

Incidentally, the voltage generator circuit shown in FIG. 4 corresponds to the reference voltage generator circuit 601 of the voltage generator circuit recently proposed by the present inventors and shown in FIG. 1. In order to apply the voltage generator circuit of FIG. 4 to a mask ROM provided with multivalued memory cells, an amplifier circuit such as the differential amplifier circuit 600 of FIG. 1 which increases the driving ability of the output of the voltage generator circuit of FIG. 4, is preferably added to the voltage generator circuit of FIG. 4. However, the voltage generator circuit of FIG. 4 can also be utilized for generating a constant voltage, without the amplifier circuit.

In the following, the operation of the voltage generator circuit of the first embodiment will be described.

The loading MOS transistor circuit 100, is supplied with the power source voltage to its source terminal and passes current to the transfer gate circuit 101 and the clamping circuit 103 as long as the CEB (Chip Enable) signal of an enabling level (LOW) is supplied to its gate terminal. The clamping circuit 103 passes the current until the voltage at its drain terminal reaches its threshold voltage. In cases where the voltage at the drain terminal of the clamping circuit 103 (i.e. the drain terminal of the transfer gate circuit 101) reached a logical threshold voltage of the inverter circuit 102, the output of the inverter circuit 102 switches from HIGH to LOW, and thereby the transfer gate circuit 101 is switched from ON to OFF. The inverter circuit 102 executes the switching according to its logical threshold voltage. Therefore, application of a high voltage (that is higher than the logical threshold voltage of the inverter circuit 102) to the drain terminal of the clamping circuit 103 is avoided.

Figure 5:
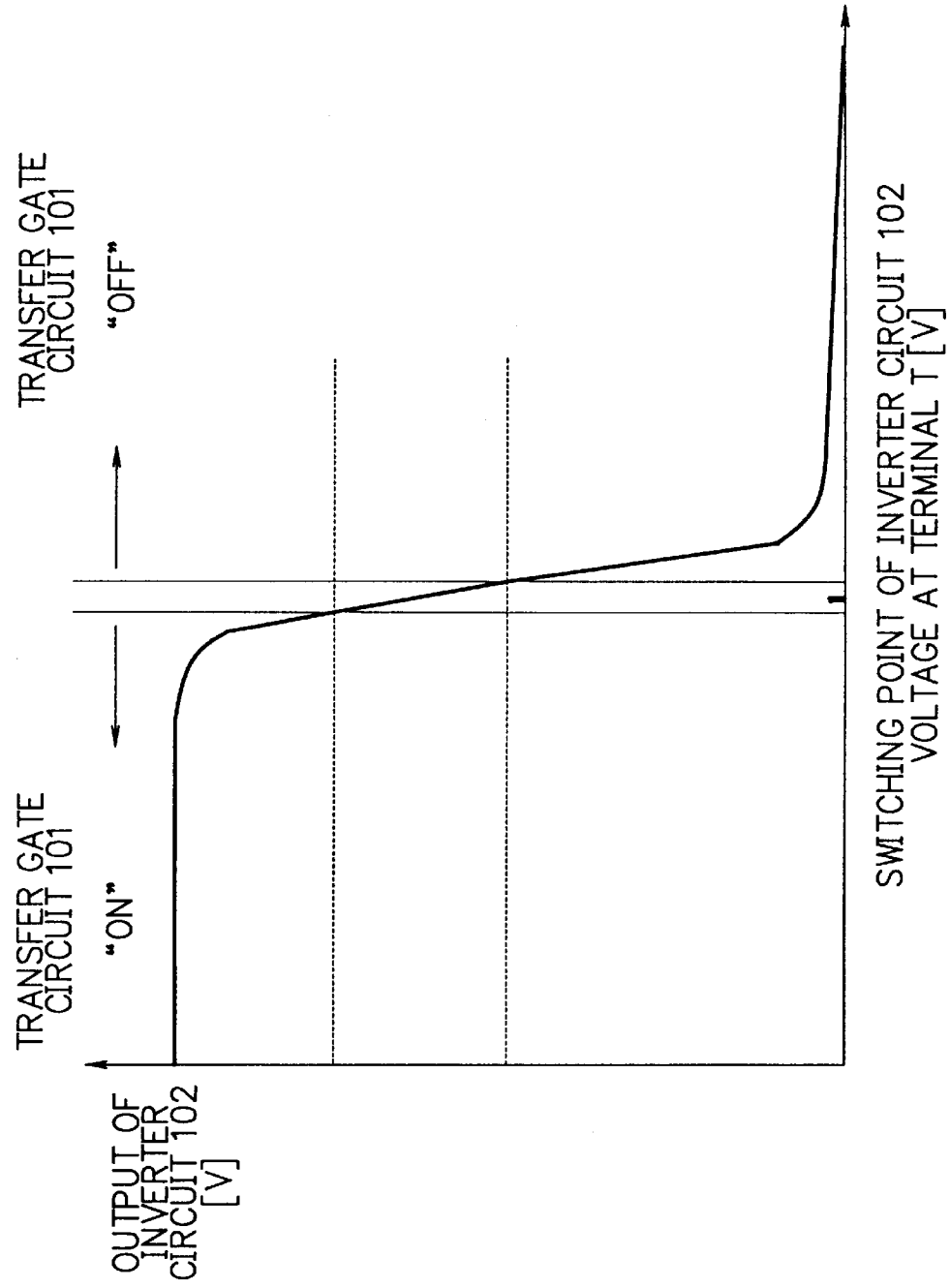
FIG. 5 is a graph showing the operation of the inverter circuit which is employed in the voltage generator circuit of FIG. 4.

FIG. 5 is a graph showing the operation of the inverter circuit 102. The output voltage of the inverter circuit 102 switches between High and Low depending on the voltage at the terminal T which is shown in FIG. 4 (i.e. the input terminal of the inverter circuit 102, the drain terminal of the clamping circuit 103, etc.). The switching occurs when the voltage at the terminal T passes through the logical threshold voltage of the inverter circuit 102. The transfer gate circuit 101 is switched ON when the output voltage of the inverter circuit 102 is HIGH (i.e. when the voltage at the terminal T is lower than the logical threshold voltage of the inverter circuit 102), and the transfer gate circuit 101 is switched OFF when the output voltage of the inverter circuit 102 is LOW (i.e. when the voltage at the terminal T is higher than the logical threshold voltage). By this operation, application of extraordinarily high voltage to the drain terminal of the clamping circuit 103 is avoided.

As described above, in the voltage generator circuit according to the first embodiment of the present invention, application of extraordinarily high voltage to the drain terminal of the clamping circuit 103 is prevented, and thereby junction destruction of the transistor composing the clamping circuit 103 can be avoided. Therefore, variations in the output voltage can be reduced and circuit reliability of the voltage generator circuit can be improved. In the case where the voltage generator circuit of the first embodiment is applied to a mask ROM that is provided with multivalued memory cells, operation reliability of the mask ROM can be secured.

Figure 6:
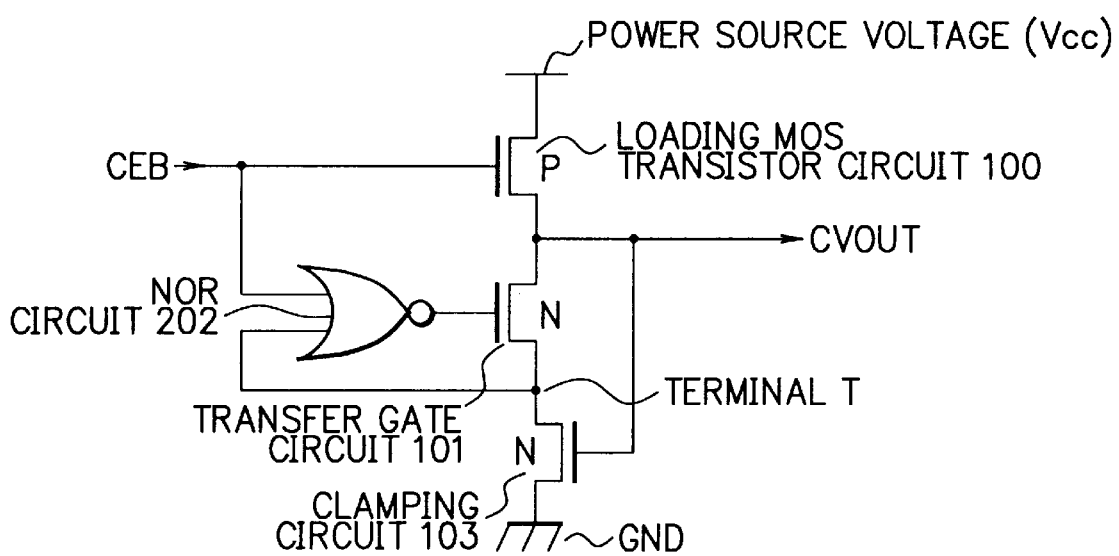
FIG. 6 is a schematic circuit diagram showing a voltage generator circuit according to a second embodiment of the present invention.

FIG. 6 is a schematic circuit diagram showing a voltage generator circuit according to a second embodiment of the present invention. Referring to FIG. 6, the voltage generator circuit of the second embodiment comprises the loading MOS transistor circuit 100 (P-channel transistor), the transfer gate circuit 101 (N-channel transistor), the clamping circuit 103 (N-channel transistor), and a NOR circuit 202.

In the second embodiment, the inverter circuit 102 of the first embodiment is replaced by the NOR circuit 202. One input terminal of the NOR circuit 202 is connected with the gate terminal of the loading MOS transistor circuit 100 and is supplied with the CEB (Chip Enable) signal. The other input terminal of the NOR circuit 202 is connected with the terminal T (the drain terminal of the clamping circuit 103), and the output terminal of the NOR circuit 202 is connected to the gate terminal of the transfer gate circuit 101, in the same way as the inverter circuit 102 of the first embodiment.

As mentioned before, the voltage generator circuit shown in FIG. 6 corresponds to the reference voltage generator circuit 601 of the voltage generator circuit which has been shown in FIG. 1. In order to apply the voltage generator circuit of FIG. 6 to a mask ROM that is provided with multivalued memory cells, an amplifier circuit such as the differential amplifier circuit 600 of FIG. 1 is preferably added to the voltage generator circuit of FIG. 6. However, it is also possible to utilize the voltage generator circuit of FIG. 6 for generating a constant voltage without the amplifier circuit.

In the following, the operation of the voltage generator circuit of the second embodiment will be described.

When the CEB (Chip Enable) signal is at an enabling level (LOW), the NOR circuit 202 operates in the same way as the inverter circuit 102 of the first embodiment and inverts the HIGH/LOW value of the terminal T, and thus the voltage generator circuit of FIG. 6 operates in the same way as the first embodiment.

When the CEB (Chip Enable) signal is at a disabling level (HIGH), the output of the NOR circuit 202 is kept LOW, and the transfer gate circuit 101 (as well as the loading MOS transistor circuit 100) is kept OFF, and thus a high voltage is not applied to the drain terminal of the clamping circuit 103 regardless of the variation in the power source voltage, and the clamping circuit 103 is protected from damage.

As described above, by the voltage generator circuit according to the second embodiment of the present invention, application of an extraordinarily high voltage to the drain terminal of the clamping circuit 103 is prevented similarly to the first embodiment. Therefore, the same effects as those of the first embodiment can be obtained.

Figure 7:
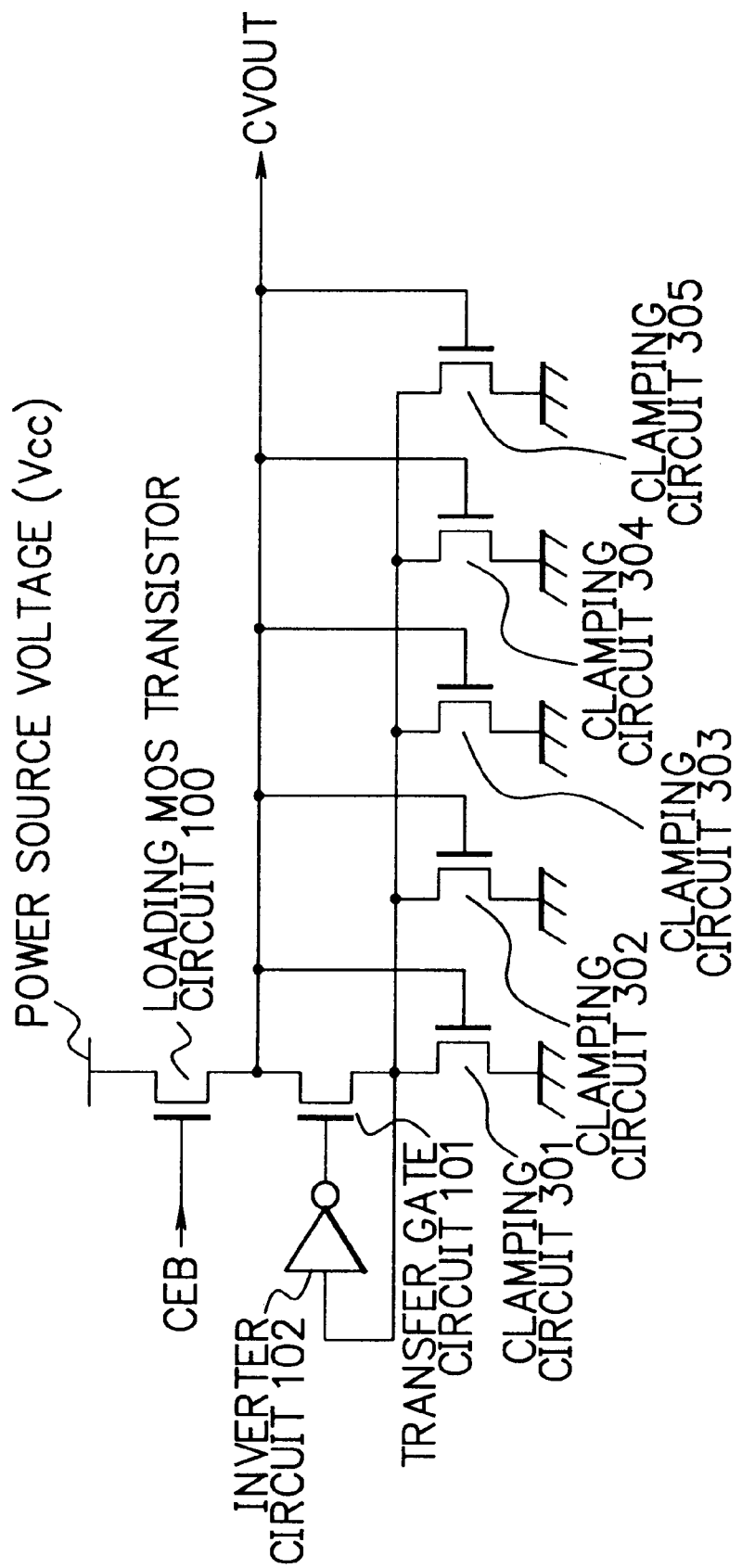
FIG. 7 is a schematic circuit diagram showing a voltage generator circuit according to a third embodiment of the present invention.

FIG. 7 is a schematic circuit diagram showing a voltage generator circuit according to a third embodiment of the present invention. Referring to FIG. 7, the voltage generator circuit of the third embodiment comprises the loading MOS transistor circuit 100 (P-channel transistor), the transfer gate circuit 101 (N-channel transistor), the inverter circuit 102, and clamping circuits 301~305 (N-channel transistors).

In the third embodiment, five clamping circuits 301~305 are connected together in parallel instead of the clamping circuit 103 of the first embodiment. By the parallel connection, the driving ability of the clamping circuits 301~305 can be arbitrarily set higher. Incidentally, the number of clamping circuits can be varied.

Figure 2:
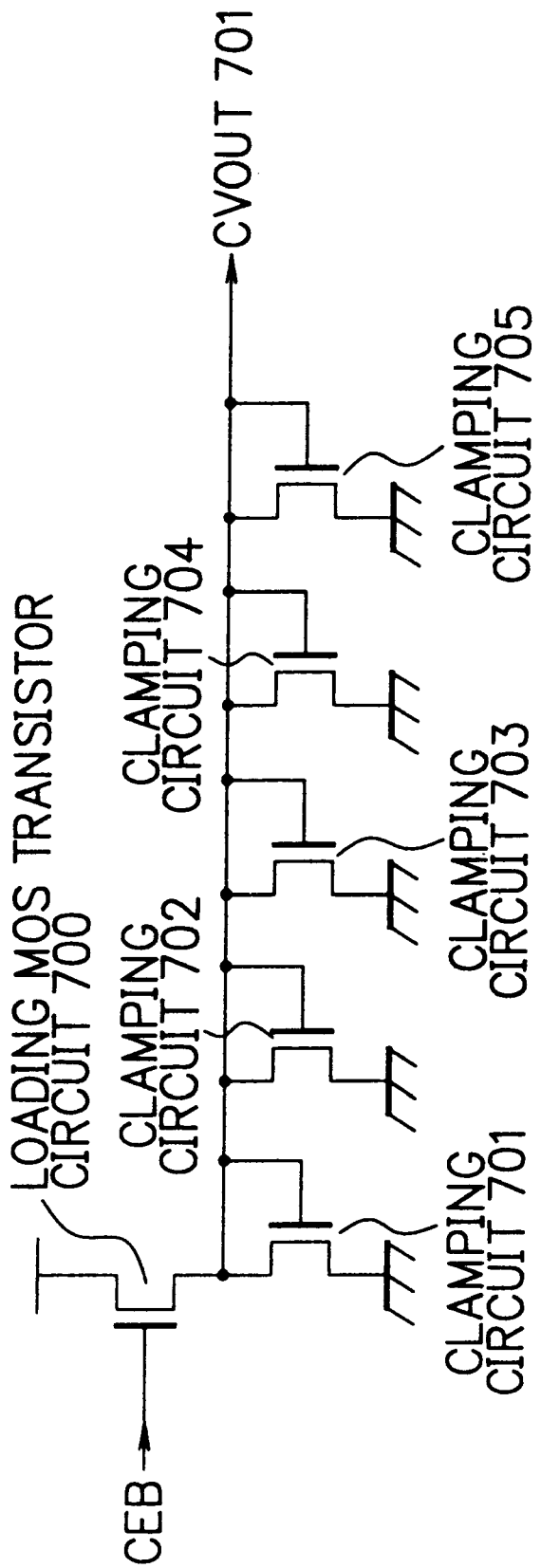
FIG. 2 is a schematic circuit diagram showing another reference voltage generator circuit which can be employed in place of the reference voltage generator circuit of FIG. 1.
Figure 3:
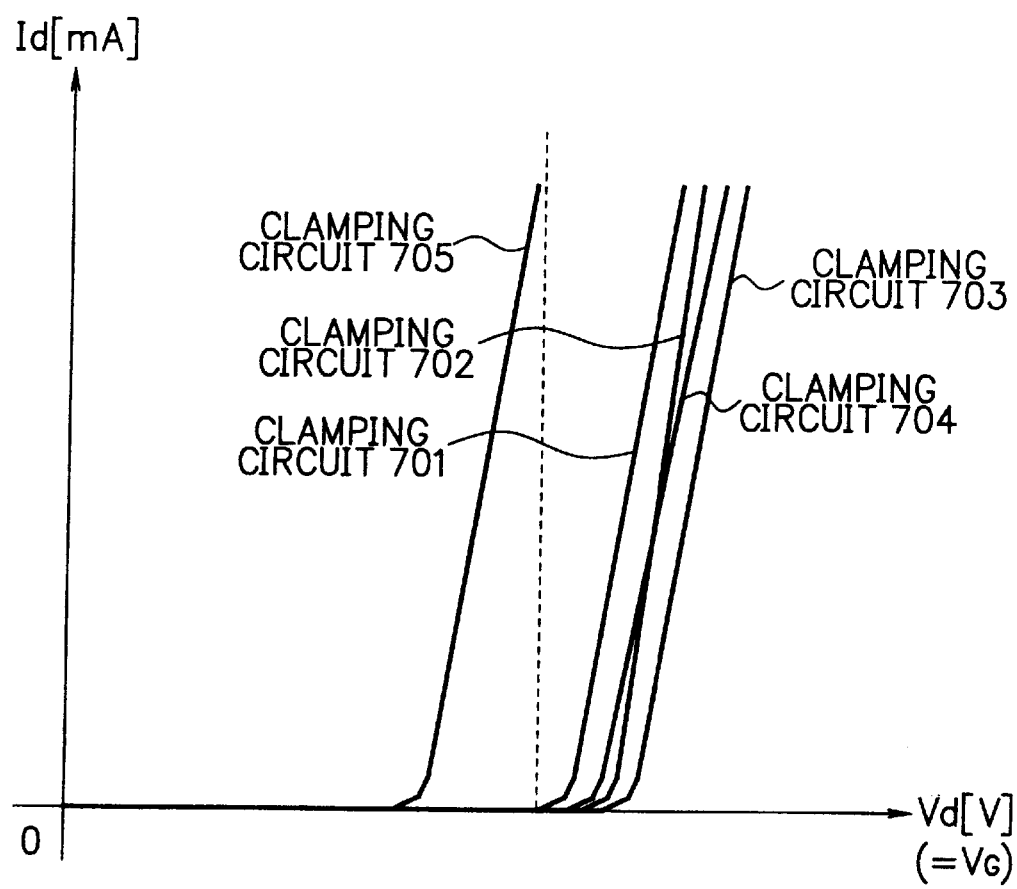
FIG. 3 is a graph showing characteristics of the clamping circuits in the voltage generator circuit of FIG. 2.
Figure 8:
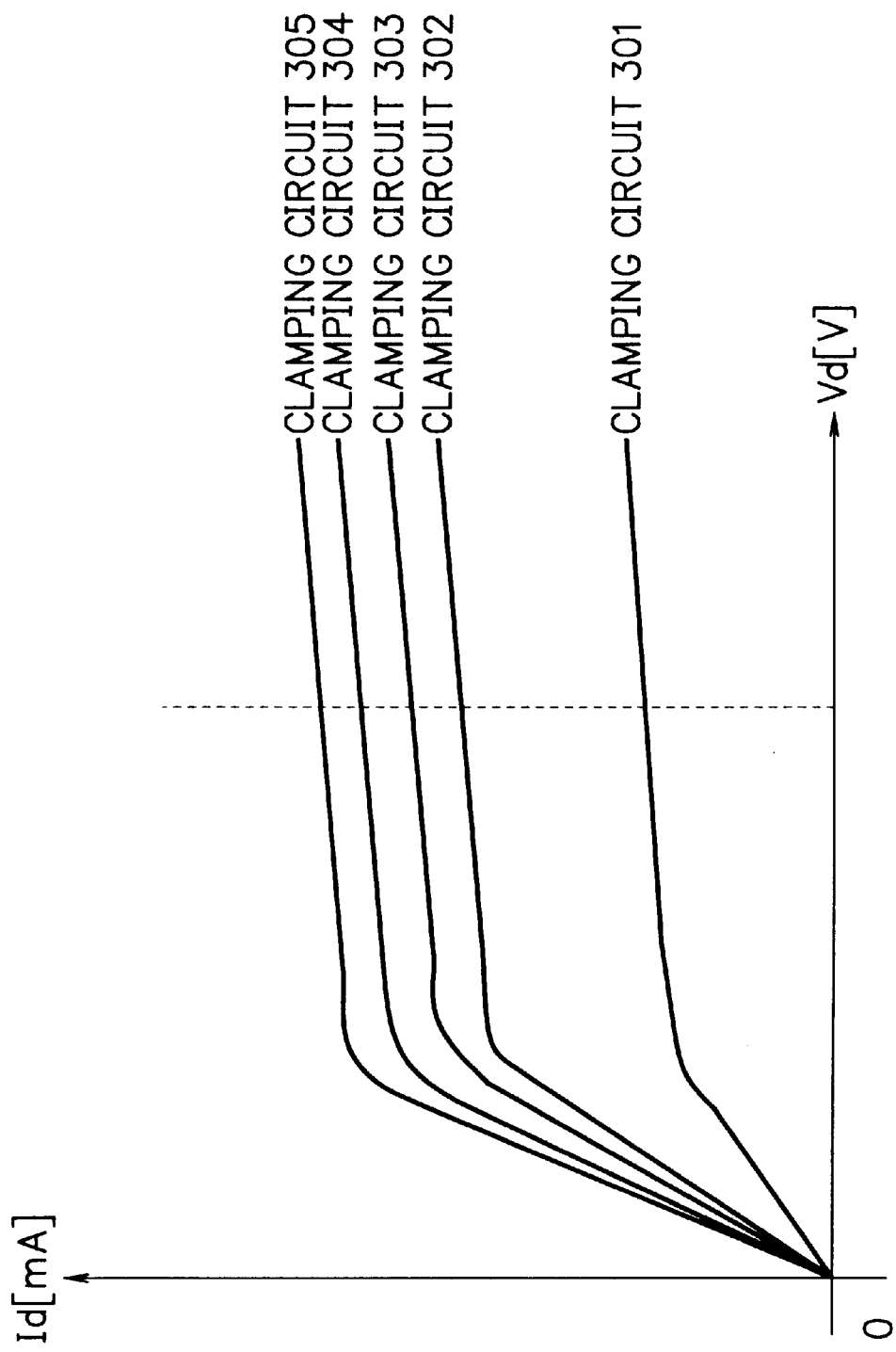
FIG. 8 is a graph showing characteristics of the clamping circuits in the voltage generator circuit of FIG. 7.

FIG. 8 is a graph showing the characteristics of the clamping circuits 301~305. As shown in FIG. 8, each of the clamping circuits 301~305 shows normal Vd-Id characteristic according to its driving ability, since the terminals of the clamping circuits are not connected by diode connections as is the case in FIGS. 2 and 3. Therefore, even if the characteristics of one clamping circuit (the clamping circuit 301 shown in FIG. 8, for example) are different from those of the other clamping circuits as shown in FIG. 8, the current which passes the parallel connection of the clamping circuits 301~305 becomes equal to the sum of currents passing each of the clamping circuits 301~305 (depending on the sum of the driving abilities of the clamping circuits 301~305), and thus the effect of the clamping circuit 301 is averaged into ⅕.

As described above, by the voltage generator circuit according to the third embodiment of the present invention, the driving ability of the clamping circuits 301~305 can be set arbitrarily higher than the loading MOS transistor circuit 100 by means of a parallel connection, and thus the response of the voltage generator circuit can be improved. In addition, the clamping circuits 301~305 of the third embodiment are not connected by diode connections in the case of FIGS. 2 and 3, and thus the clamping circuits 301~305 can display reliable characteristics even if the characteristics of one clamping circuit are different from those of the other clamping circuits in the parallel connection, in contrast to the case of FIGS. 2 and 3.

Figure 9:
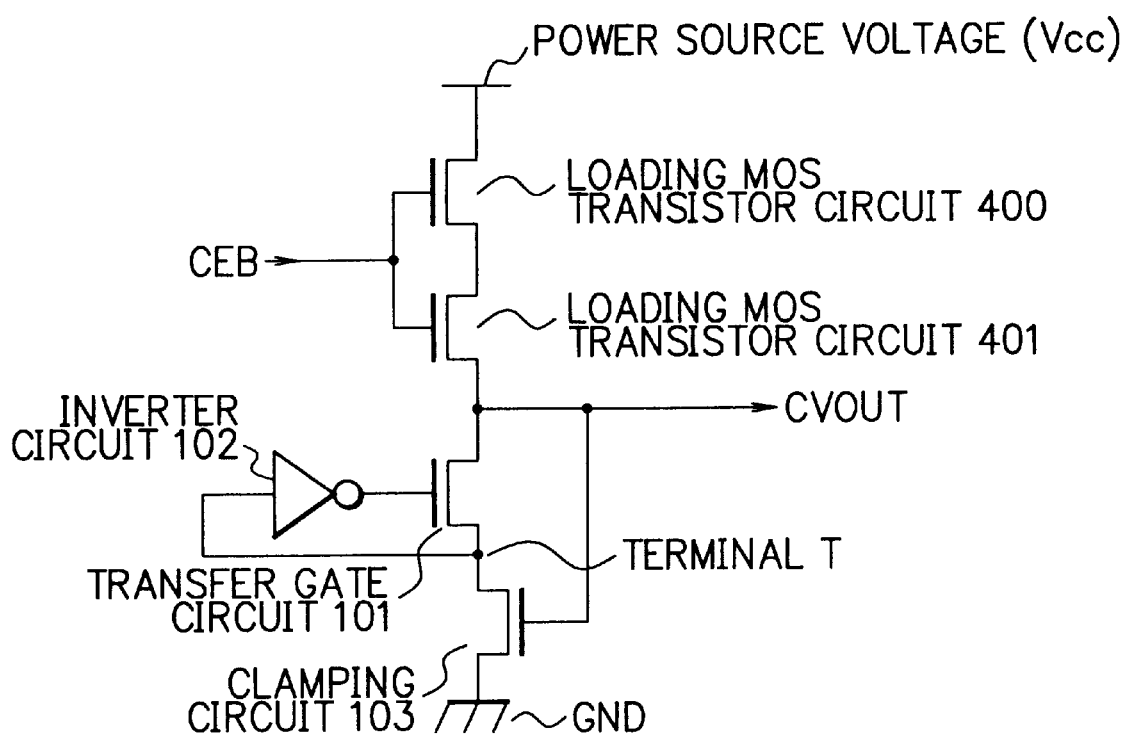
FIG. 9 is a schematic circuit diagram showing a voltage generator circuit according to a fourth embodiment of the present invention.

FIG. 9 is a schematic circuit diagram showing a voltage generator circuit according to a fourth embodiment of the present invention. Referring to FIG. 9, the voltage generator circuit of the fourth embodiment comprises a first loading MOS transistor circuit 400 (P-channel transistor), a second loading MOS transistor circuit 401 (P-channel transistor), the transfer gate circuit 101 (N-channel transistor), the inverter circuit 102, and the clamping circuit 103 (N-channel transistor).

In the fourth embodiment, a series connection of the first loading MOS transistor circuit 400 and the second loading MOS transistor circuit 401 is employed instead of the loading MOS transistor circuit 100 of the first embodiment. The gate terminals of the loading MOS transistor circuits 400 and 401 are supplied with the CEB (Chip Enable) signal. By the series connection, the driving ability of the loading MOS transistor circuits 400 and 401 can be set lower. Incidentally, the number of the loading MOS transistor circuits can be varied.

As described above, by the voltage generator circuit according to the fourth embodiment of the present invention, the driving ability of the loading MOS transistor circuit (i.e. the loading MOS transistor circuits 400 and 401) can be set lower. Generally, the clamping circuit 103 is composed of a transistor having the same construction and dimensions as those of the memory cell in the mask ROM. By the fourth embodiment, the driving ability of the clamping circuit 103 can be kept higher than that of the loading MOS transistor circuits 400 and 401 without requiring high driving ability of the clamping circuit 103. Therefore, generation of constant voltage can be realized without altering the construction and dimensions of the general clamping circuit 103 and raising the driving ability of the clamping circuit 103.

As set forth hereinabove, in the voltage generator circuits according to the present invention, when the voltage at the drain terminal of the clamping circuit becomes as high as the logical threshold voltage of the inverter circuit, the output of the inverter circuit is switched from HIGH to LOW and thereby the transfer gate circuit is switched from ON to OFF. The inverter circuit executes the switching according to its logical threshold voltage, and thus application of an extraordinarily higher voltage (than the logical threshold voltage of the inverter circuit) to the drain terminal of the clamping circuit can be prevented, and thereby junction destruction of the transistor composing the clamping circuit can be avoided. Therefore, variation of the output voltage can be reduced and circuit reliability of the voltage generator circuit can be improved. In the case where the voltage generator circuit according to the present invention is applied to a mask ROM that is provided with multivalued memory cells, operation reliability of the mask ROM can be secured.

While the present invention has been described with reference to the particular illustrative embodiments, it is not to be restricted by those embodiments but only by the appended claims. For example, combinations of the embodiments described above, such as a combination of the use of the NOR gate of the second embodiment and the parallelly connected clamping circuits of the third embodiment; a combination of the use of the NOR gate of the second embodiment and the series-connected loading MOS transistor circuits of the fourth embodiment; a combination of the use of the NOR gate of the second embodiment and the parallelly connected clamping circuits of the third embodiment and the series-connected loading MOS transistor circuits of the fourth embodiment; etc. are also possible. It is to be appreciated that those skilled in the art can change or modify the embodiments without departing from the scope and spirit of the present invention.

What is claimed is:

1. A voltage generator circuit comprising:

a loading transistor circuit having a source terminal, a drain terminal, and a gate terminal, the source terminal of the loading transistor circuit being supplied with a power source voltage;

a transfer gate circuit having a source terminal, a drain terminal, and a gate terminal, the source terminal of the transfer gate circuit being connected with the drain terminal of the loading transistor circuit; and a clamping circuit having a source terminal, a drain terminal, and a gate terminal, the drain terminal of the clamping circuit being connected with the drain terminal of the transfer gate circuit and the source terminal of the clamping circuit being grounded, wherein:

the gate terminal of the loading transistor circuit is supplied with a CEB (Chip Enable) signal, the gate terminal of the transfer gate circuit is supplied with a signal from the drain terminal of the transfer gate circuit which has been inverted, the gate terminal of the clamping circuit is connected with the drain terminal of the loading transistor circuit, and the drain terminal of the loading transistor circuit, the source terminal of the transfer gate circuit and the gate terminal of the clamping circuit are all connected together to operate as an output terminal of the voltage generator circuit for outputting a constant voltage.

2. A voltage generator circuit as claimed in claim 1, wherein the clamping circuit is composed of a parallel connection of two or more MOS transistors.

3. A voltage generator circuit as claimed in claim 1, wherein the loading transistor circuit is composed of a series connection of two or more transistors having gate terminals are supplied with the CEB (Chip Enable) signal.

4. A voltage generator circuit as claimed in claim 1, further comprising an inverter circuit having an input terminal connected with the drain terminal of the clamping circuit and an output terminal connected with the gate terminal of the transfer gate circuit, the inverter circuit being provided for inverting the signal obtained from the drain terminal of the transfer gate circuit.

5. A voltage generator circuit as claimed in claim 4, wherein the clamping circuit is composed of a parallel connection of two or more MOS transistors.

6. A voltage generator circuit as claimed in claim 4, wherein the loading transistor circuit is composed of a series connection of two or more transistors having gate terminals which are supplied with the CEB (Chip Enable) signal.

7. A voltage generator circuit as claimed in claim 1, further comprising a NOR circuit having a first input terminal connected with a drain terminal of the clamping circuit, a second input terminal supplied with the CEB (Chip Enable) signal, and an output terminal connected with the gate terminal of the transfer gate circuit, the NOR circuit being provided for obtaining the signal from the drain terminal of the transfer gate circuit which has been inverted.

8. A voltage generator circuit as claimed in claim 7, wherein the clamping circuit is composed of a parallel connection of two or more MOS transistors.

9. A voltage generator circuit as claimed in claim 7, wherein the loading transistor circuit is composed of a series connection of two or more transistors having gate terminals supplied with the CEB (Chip Enable) signal.

10. A voltage generator circuit as claimed in claim 1, further comprising a differential amplifier which is connected to the output terminal for increasing driving ability.

11. A voltage generator circuit as claimed in claim 10, wherein the voltage generator circuit is incorporated into a semiconductor memory device that is provided with multi-valued memory cells in which threshold voltages selected from a plurality of threshold voltages are set according to write data.

* * * * *